(12) United States Patent
Yoo

(10) Patent No.: US 6,808,379 B2
(45) Date of Patent: Oct. 26, 2004

(54) CLEANER FOR MOLDING APPARATUS OF SEMICONDUCTOR CHIP PACKAGES

(75) Inventor: Cheol Joon Yoo, Cheonan (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 217 days.

(21) Appl. No.: 10/029,165

(22) Filed: Dec. 20, 2001

(65) Prior Publication Data

US 2002/0166504 A1 Nov. 14, 2002

(30) Foreign Application Priority Data

May 10, 2001 (KR) ........................................ 2001-25410

(51) Int. Cl.[7] ........................... B29C 33/58; B29C 33/72
(52) U.S. Cl. ....................... 425/100; 425/116; 425/215; 425/216; 425/225; 425/226
(58) Field of Search ........................... 425/98, 100, 116, 425/215, 216, 225, 226

(56) References Cited

U.S. PATENT DOCUMENTS

| | | | | |
|---|---|---|---|---|
| 5,053,173 A | * | 10/1991 | Sticht | 264/39 |
| 5,297,897 A | * | 3/1994 | Venrooij et al. | 425/116 |
| 5,783,220 A | * | 7/1998 | Osada et al. | 425/116 |
| 6,071,107 A | * | 6/2000 | Harmsen et al. | 425/116 |
| 6,140,659 A | * | 10/2000 | Shizuka | 250/504 R |

FOREIGN PATENT DOCUMENTS

| | | | | |
|---|---|---|---|---|
| JP | 04-371810 | | 12/1992 | |
| JP | 07136599 A | * | 5/1995 | B08B/1/04 |

OTHER PUBLICATIONS

Foreign Office Action dated Apr. 3, 2003.

* cited by examiner

Primary Examiner—Robert B. Davis
(74) Attorney, Agent, or Firm—Harness, Dickey & Pierce, P.L.C.

(57) ABSTRACT

An apparatus for cleaning a mold die set includes a pair of brushes, a pair of vacuum holes, and multiple nozzles. One of the brushes is positioned to scrub a first surface of the mold die set, and the other of the brushes is positioned to scrub a second surface of the mold die set to separate a residue from the first and second surfaces of the mold die set. The vacuum holes receives the separated residue from the first and second surfaces of the mold die set, and through the nozzles, a parting compound is provided to coat the first and second surfaces of the mold die set. The apparatus further includes multiple air holes through which air is blown to the first and second surfaces of the mold die set. An apparatus for semiconductor manufacturing includes a mold die set having a first surface and a second surface and a mold die set cleaner that can remove a residue from the first and second surfaces of the mold die set and coat a parting compound on the first and second surfaces.

15 Claims, 6 Drawing Sheets

CLEANER FOR MOLDING APPARATUS OF SEMICONDUCTOR CHIP PACKAGES

BACKGROUND OF THE INVENTION

1. Field of the Invention

The present invention relates to an apparatus for semiconductor manufacturing and more particularly, to a cleaner of a molding apparatus of semiconductor chip packages.

2. Description of the Related Arts

During a molding step, semiconductor chips mounted on and electrically connected to a lead frame or a printed circuit board are encapsulated with a molding compound, which forms a package body, for the purpose of protecting the semiconductor chips from the external environment. A conventional molding apparatus includes mold dies with cavities, each of which is in a package body shape. The semiconductor chips on the lead frame or the printed circuit board is placed in the cavities of the mold die. Then, the molding compound is injected in liquid state into the cavities and hardened.

The molding compound is mainly composed of thermosetting resin and silica particles. The mold dies are abraded by the silica particles, and the abrasion produces a gap between and in the mold dies. During the molding step, the molding compound may leak through the gap, leaving molding compound residue in and on the mold dies and thus, causing troubles in the next molding. Accordingly, the molding step is accompanied by a cleaning step for removing the molding compound residues from the mold die.

With reference to FIGS. 1a and 1b, which illustrate a conventional cleaner for a molding apparatus, a conventional cleaning step is explained.

Referring to FIGS. 1a and 1b, a molding apparatus 200 includes a cleaner 230 placed next to a molding die set 210. The molding die set 210 consists of an upper molding die 211 with cavities and a lower molding die 212. The cleaner 230 includes a cleaning head 231, and a motor 243 that provides vibration motion to the cleaning head 231. The motor 243 is connected to the cleaning head 231 by a concentric shaft 245. The cleaning head 231 includes a brush 234 for separating the resin residues from the molding die set 210, and a vacuum hole 241 for sucking the resin residues. The vacuum hole 241 is connected to a vacuum hose 259 and further to an external vacuum suction means (not shown).

After unloading the semiconductor packages from the molding die 210 by separating the upper molding die 211 and the lower molding die 212 from each other, the cleaning head 231 advances to between the upper molding die 211 and the lower molding die 212. Then, the brush 234 vibrates and separates the resin residues from the molding die 210. The separated resin residues are removed through the vacuum hole 241. This cleaning step is carried out after each molding step.

After a number of molding and cleaning steps, a step for coating a parting compound is carried out. The parting compound serves to easily remove the semiconductor packages from the molding dies. In the parting compound-coating step, the molding apparatus executes at least one molding step using an epoxy molding compound having a large quantity of the parting compound, in order to coat the parting compound on the surface of the molding dies.

The above-described molding step has several problems. The parting compound-coating step is carried out by stopping the normal operation of the molding apparatus, and the molding compound having the parting compound is supplied into the molding apparatus manually by an operator. Therefore, the production rate of the semiconductor packages is limited.

SUMMARY OF THE INVENTION

An aspect of the present invention provides an apparatus for cleaning a mold die set. The apparatus includes a pair of brushes, a pair of vacuum holes, and multiple nozzles. One of the brushes is positioned to scrub a first surface of the mold die set, and the other of the brushes is positioned to scrub a second surface of the mold die set to separate a residue from the first and second surfaces of the mold die set. The brushes vibrate to perform the scrubbing. The vacuum holes receives the separated residue from the first and second surfaces of the mold die set, and through the nozzles, a parting compound is provided to coat the parting compound on the first and second surfaces of the mold die set. The parting compound is provided by spraying from the nozzles. The apparatus further includes multiple air holes through which air is blown to the first and second surfaces of the mold die set.

Another aspect of the present invention provides an apparatus for semiconductor manufacturing. The apparatus includes a mold die set having a first surface and a second surface and a mold die set cleaner that can remove a residue from the first and second surfaces of the mold die set and coat a parting compound on the first and second surfaces. The mold die set cleaner includes: a brush that scrubs the first surface of the mold die set to separate the residue from the first surface; a vacuum hole that receives the separated residue from the first surface of the mold die set; and nozzles through which a parting compound is provided to coat the parting compound on the first surface of the mold die set. The mold die set cleaner further includes air holes through which air is blown to the first and second surfaces of the mold die set. The mold die set cleaner also further includes: a second brush that scrubs the second surface of the mold die set to separate the residue from the second surface of the mold die set; other nozzles through which the parting compound is provided to coat the parting compound on the second surface of the mold die set; and a second vacuum hole that receives the separated residue from the second surfaces of the mold die set.

BRIEF DESCRIPTION OF THE DRAWINGS

The features and advantages of the present invention will be readily understood with reference to the following detailed description thereof provided in conjunction with the accompanying drawings, wherein like reference numerals designate like structural elements, and, in which:

FIG. 1b is a bottom view of a conventional cleaner of the molding apparatus of FIG. 1a;

FIG. 3b is a bottom view of the cleaner of the molding apparatus of FIG. 3a.

DETAILED DESCRIPTION OF THE PREFERRED EMBODIMENTS

Figure 1A:
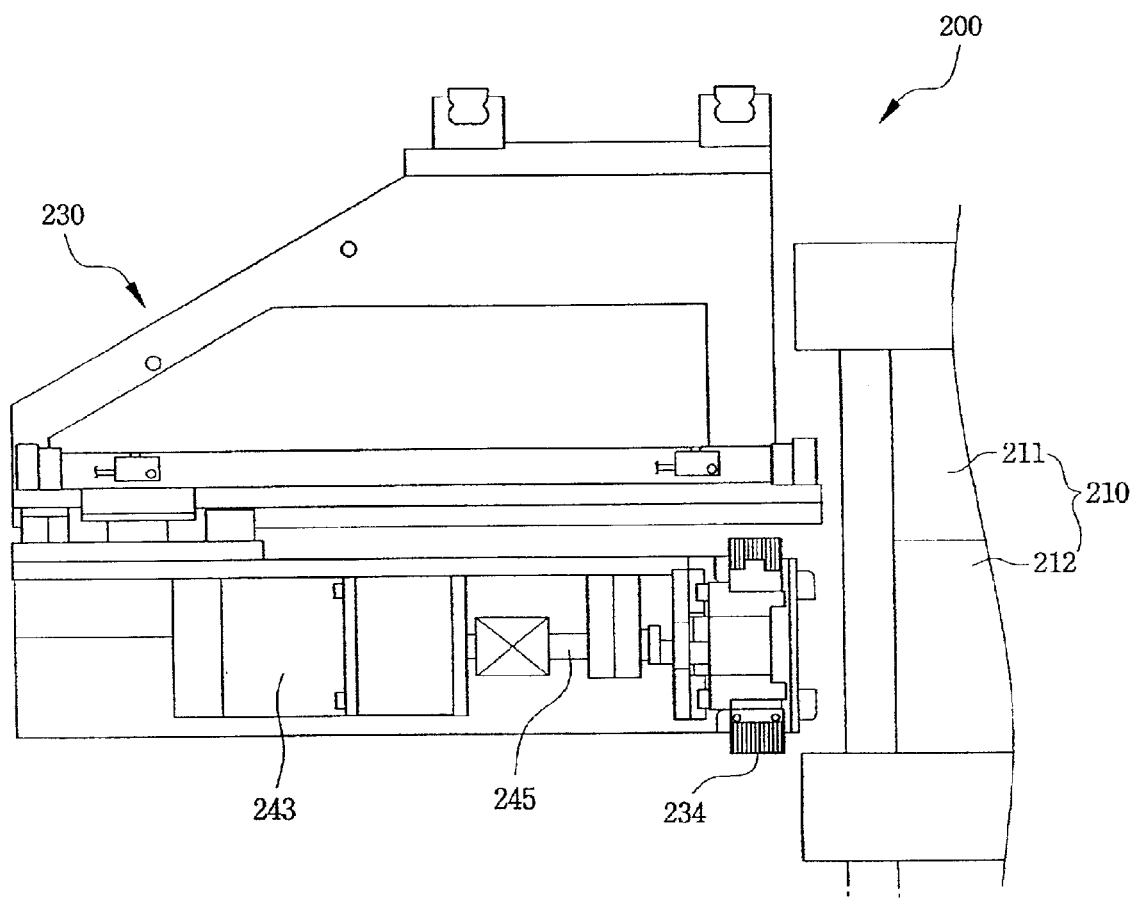
FIG. 1a is a side view of a conventional molding apparatus of semiconductor chip packages.
Figure 1B:
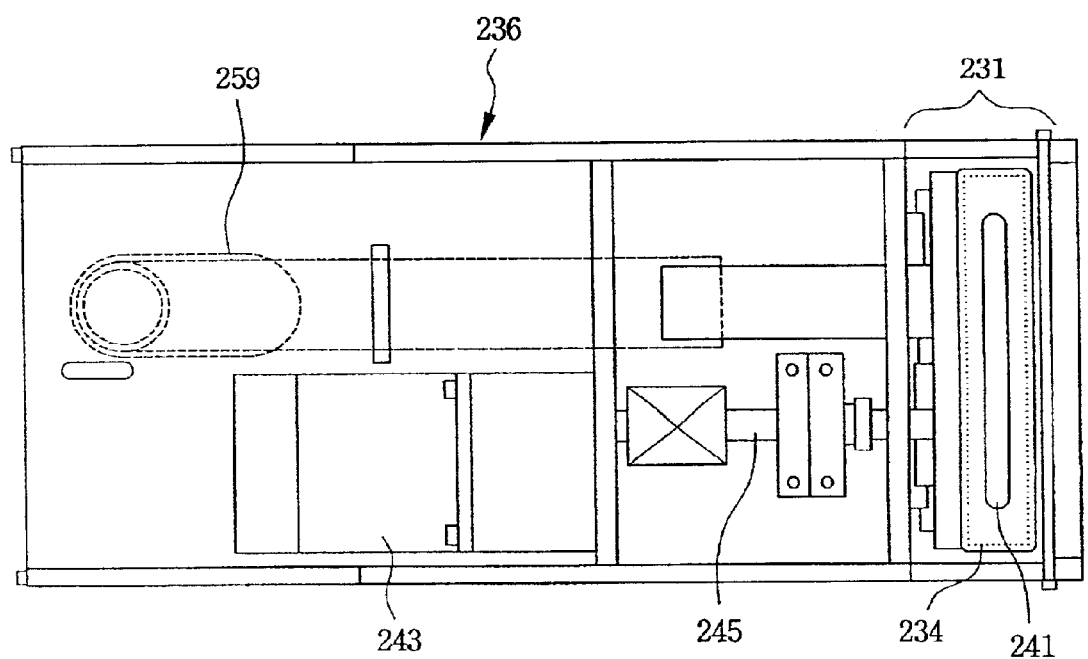
Figure 2:
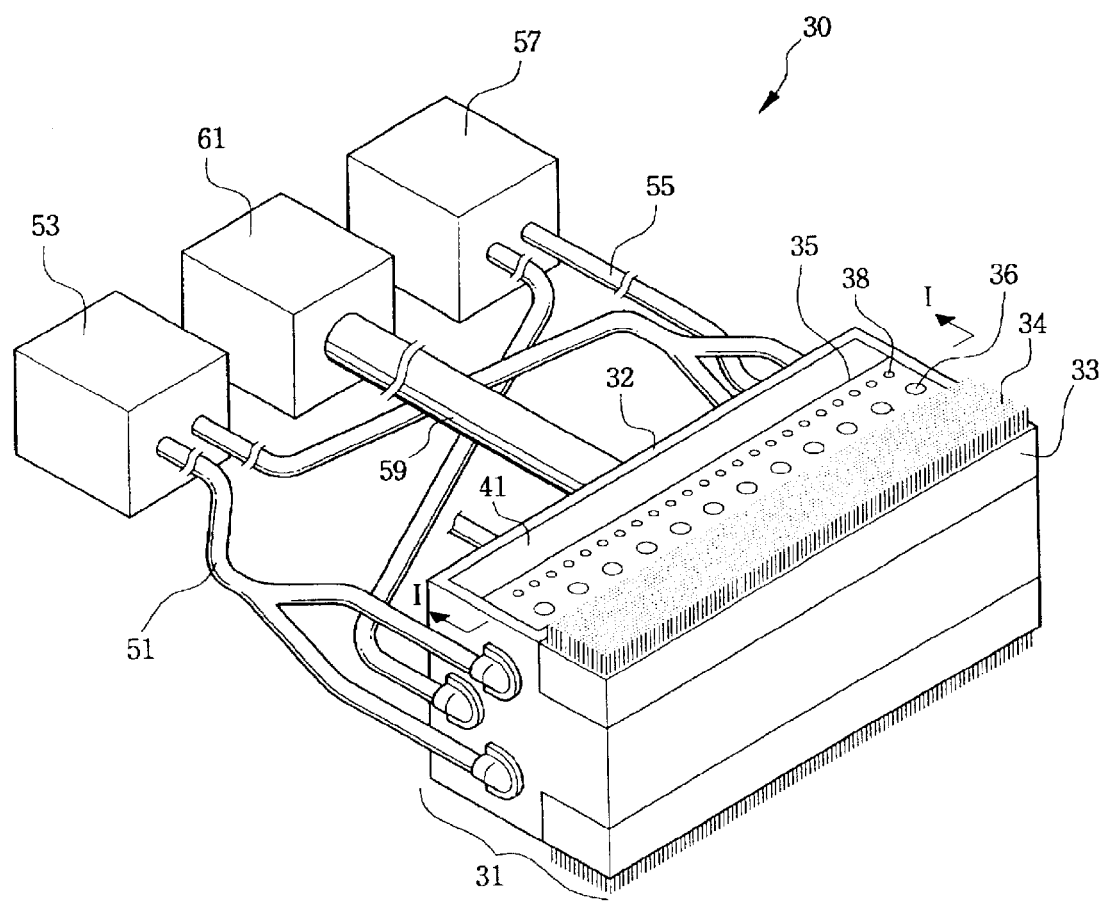
FIG. 2 is a perspective view of a cleaner in accordance with an embodiment of the present invention.

FIG. 2 is a perspective view of a cleaner 30 in accordance with an embodiment of the present invention. The cleaner 30 includes a cleaning head 31, a vacuum pump 61, an air pump 53, and a parting compound tank 57. The vacuum pump 61, air pump 53, and parting compound tank 57 are connected to cleaning head 31 via a vacuum pipe 59, an air pipe 51, and a parting compound pipe 55, respectively.

The upper side and the lower side of the cleaning head 31 have identical structure. The cleaning head 31 includes two brush blocks 33, each of which is on the upper side and the lower side of the cleaning head 31 for separating resin residues from the molding dies 11 and 12 (FIG. 3a), and a nozzle block 35. Each of the brush blocks 33 has a brush 34, and the nozzle block 35 has multiple air blowing holes 36 and multiple nozzles 38, which are disposed on the both sides of the cleaning head 31. The brush block 33 is formed at one end of the cleaning head 31, and the nozzle block 35 is placed in the cleaning head 31. A vacuum hole 41, which is formed in a head body 32 of the cleaning head 31, is disposed on the other end of the cleaning head 31.

The vacuum pump 61 is connected to the vacuum hole 41 by the vacuum pipe 59. The air pump 53 that provides air at a predetermined pressure is connected to the air blowing holes 36 by the air pipe 51. The parting compound tank 57 that provides a parting compound at a predetermined pressure is connected to the nozzles 38 by the parting compound pipe 55. A liquid wax may be used as the parting compound.

Figure 3A:
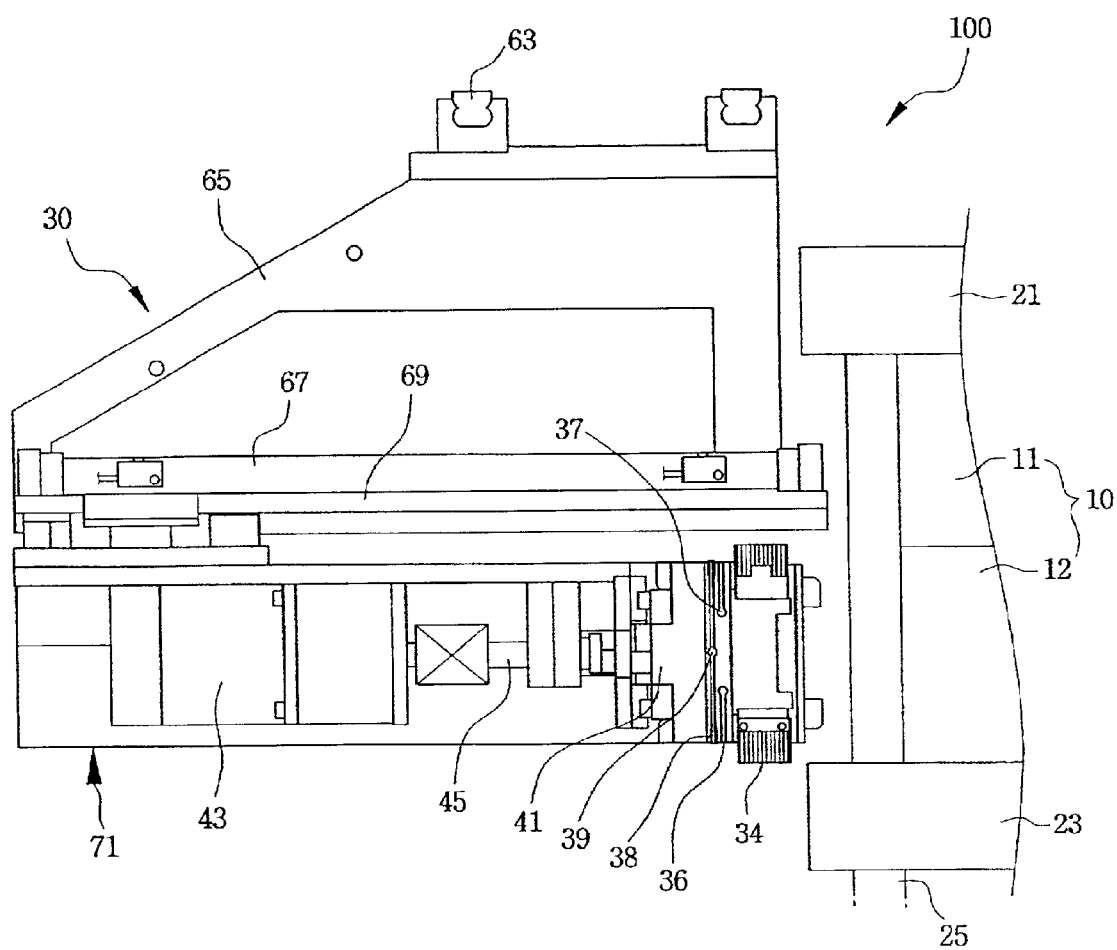
FIG. 3a is a side view of a molding apparatus in accordance with another embodiment of the present invention.
Figure 3B:
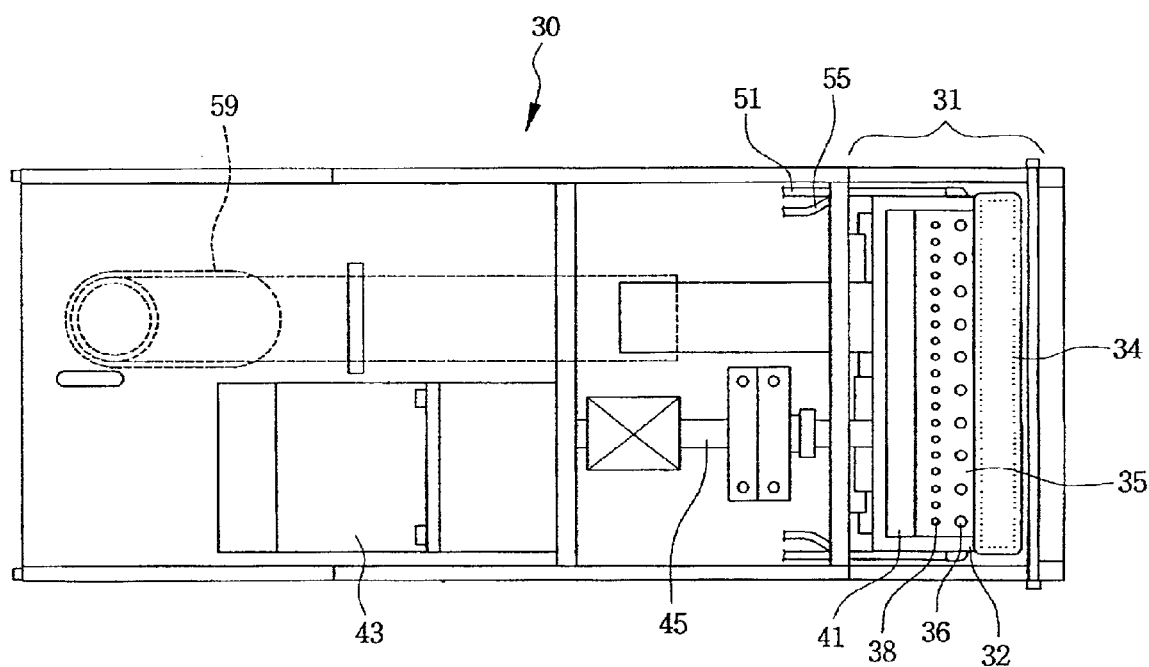

FIG. 3a is a side view of a molding apparatus 100 in accordance with an embodiment of the present invention, and FIG. 3b is a bottom view of a cleaner which is similar to cleaner 30 of FIG. 2. Referring to FIGS. 2, 3a and 3b, in order to easily replace a worn-out brush with a new one, the brush 34 is separable from the brush block 33. The air blowing holes 36 and the nozzles 38 are formed in a row on the nozzle block 35. The vacuum hole 41 for sucking the resin residues is disposed next to the nozzle block 35. The air pipe 51 is connected to the air blowing holes 36 via an air manifold 37. The nozzles 38 are connected to the parting compound pipe 55 via a parting compound manifold 39. The vacuum hole 41 is connected to the vacuum pump 61 via the vacuum pipe 59, thereby supplying vacuum suction force. The air blowing pipe 51, the parting compound pipe 55, and the vacuum pipe 59 can be made of a flexible material.

As illustrated in FIG. 3a, the cleaner 30 further includes a first guide rail 63, a second guide rail 69, a motor 43, an air cylinder 67, a first transferring unit 65, and a second transferring unit 71. The first guide rail 63 guides the cleaning head 31 to move to and from a molding die set 10 of the molding apparatus 100. The motor 43, which is formed within the second transferring unit 71, provides vibration to the cleaning head 31. The motor 43 is connected to the cleaning head 31 by a concentric shaft 45. The air cylinder 67, which is formed within the first transferring unit 65, drives the second transferring unit 71 to and from the molding die set 10. The second guide rail 69 is formed under the air cylinder 67 so as to connect the air cylinder 67 to the second transferring unit 71.

A cleaning method of apparatus 100 is explained in accordance with an embodiment of the present invention.

The molding apparatus 100 includes an upper support 21, which supports the upper molding die 11, a lower support 23, which supports the lower molding die 12, and a supporter guide rail 25. The upper and lower supports 21 and 23 move vertically along the support guide rail 25.

After unloading the semiconductor packages after molding step from the molding die set 10, the cleaner 30 begins a cleaning operation, while the upper molding die 11 and the lower molding die 12 are spaced apart after the unloading. The first transferring unit 65 moves along the first guide rail 63 to the molding die set 10. Then, the air cylinder 67 of the first transferring unit 65 moves along the second guide rail 69, so that the second transferring unit 71 moves into the space between the upper molding die 11 and the lower molding die 12. Next, the motor 43 vibrates the brush 34 via the concentric shaft 45, so that the vibration can separate the compound residues by scrubbing the inner surfaces of the upper molding die 11 and the lower molding die 12. During or after the vibration of the brush 34, the air pump 53 blows air at a predetermined pressure through the air blowing holes 36 toward the inner surfaces of the upper molding die 11 and the lower molding die 12 to promote the separation of the compound residue. Then, the separated residues are sucked through the suction hole 41 and removed via the vacuum pipe 59. The cleaning follows each molding step.

After a predetermined number of molding and cleaning steps, the parting compound is applied to the inner surfaces of the upper and lower molding dies 11 and 12. As in the cleaning operation, the cleaning head 31 moves into the space between the upper molding die 11 and the lower molding die 12, and then the nozzles 38 spray the parting compound on the inner surfaces of the upper and lower molding dies 11 and 12, where cavities are formed.

Figure 4:
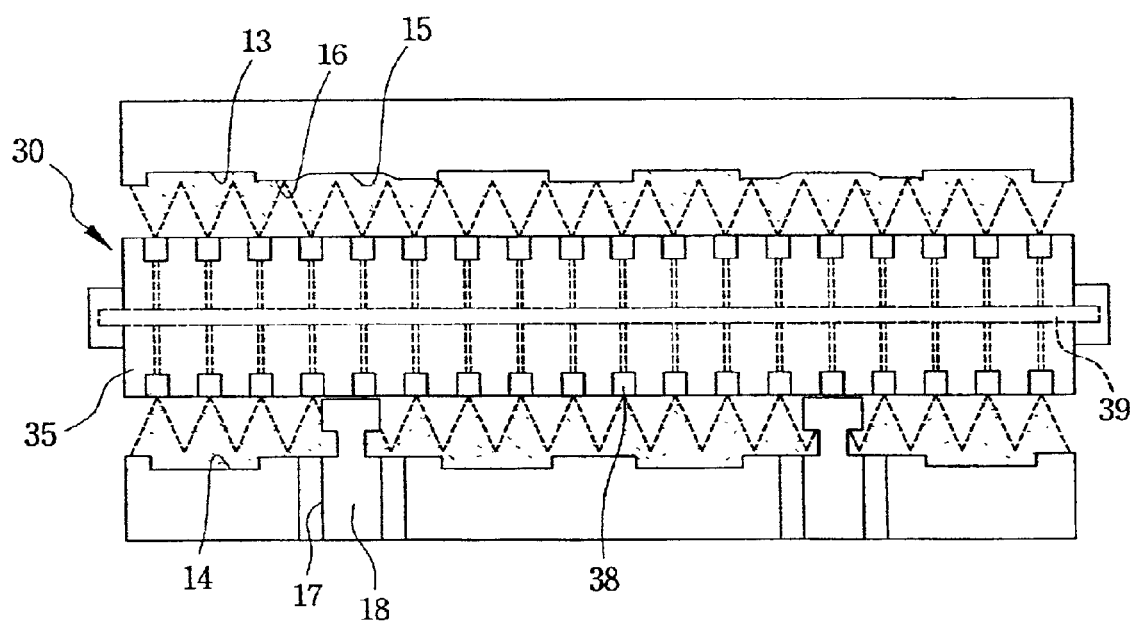
FIG. 4 is a cross-sectional view taken along line I—I of FIG. 2 of a cleaning head of a cleaner in accordance with another embodiment of the present invention.

FIG. 4 illustrates the coating of a parting compound to the inner surfaces of the molding die.

As shown in FIG. 4, the nozzles 38 spray the parting compound toward culls 15, runners 16 and cavities 13 of the upper molding die 11, and cavities 14 and plungers 18 of the lower molding die 12. That is, all inner surfaces of the upper molding die 11 and the lower molding die 12 are coated with the parting compound. The parting compound is provided to the nozzles 38 via the parting compound manifold 39 of the nozzle block 35. After completing the parting compound-coating step, the cleaning head 31 moves backward and a new molding cycle starts.

In accordance with the present invention, the cleaner performs the parting compound coating automatically. Thus, the molding equipment of the present invention consumes less time for cleaning, and does not require an operator who operates the cleaning work manually.

Although the specific embodiments of the present invention have been described in detail hereinabove, it should be understood that many variations and/or modifications of the basic inventive concepts herein taught which may appear to those skilled in the art will still fall within the spirit and scope of the present invention as defined in the appended claims.

What is claimed is:

1. An apparatus for cleaning a mold die set, comprising:
   a brush that scrubs a surface of the mold die set to separate a residue from the surface;
   a vacuum hole that receives the separated residue from the surface of the mold die set;
   a plurality of holes configured in a row through which air is blown to the surface of the mold die set; and
   a plurality of nozzles through which a parting compound is provided to coat the surface of the mold die set.

2. The apparatus of claim 1, further comprising a mechanism to vibrate the brush.

3. The apparatus of claim 1, further comprising a second brush that scrubs a second surface of the mold die set to separate residue from the second surface of the mold die set.

4. The apparatus of claim 1, further comprising a second plurality of nozzles through which the parting compound is provided to coat the parting compound on the second surface of the mold die set.

5. The apparatus of claim 4, wherein the parting compound is provided by being sprayed from the second plurality of nozzles.

6. The apparatus of claim 1, wherein the parting compound is provided by being sprayed from the plurality of nozzles.

7. An apparatus for cleaning a mold die set, comprising:
- a pair of brushes, one of the brushes being positioned to scrub a first surface of the mold die set and the other of the brushes being positioned to scrub a second surface of the mold die set, wherein the scrubbing is to separate a residue from the first and second surfaces of the mold die set;
- a mechanism to vibrate the brushes;
- a pair of vacuum holes that receives the separated residue from the first and second surfaces of the mold die set, respectively;
- a plurality of nozzles configured on a first nozzle block and plurality of nozzles configured on a second nozzle block through which a parting compound is provided to coat the parting compound on the first and second surfaces of the mold die set, respectively; and
- a plurality of holes through which air is blown to the first and second surfaces of the mold die set.

8. An apparatus for semiconductor manufacturing, comprising:
- a mold die set having a first surface and a second surface; and
- a mold die set cleaner that removes a residue from the first and second surfaces of the mold die set and applies a parting compound to the first and second surfaces;
- a first plurality of nozzles through which the parting compound is provided to the first surface;
- a first and second plurality of holes configured in a row on the mold die set cleaner through which air is blown to the first surface of the mold die set;
- a first brush that scrubs the first surface of the mold die set to separate the residue from the first surface;
- a vacuum hole that receives the separated residue from the first surface of the mold die set; and
- a second plurality of nozzles through which a parting compound is provided to coat the second surface of the mold die set.

9. The apparatus of claim 8, further comprising a mechanism to vibrate the first brush.

10. The apparatus of claim 8, wherein the mold die set cleaner further comprises a second brush that scrubs the second surface of the mold die set to separate the residue from the second surface of the mold die set.

11. The apparatus of claim 8, wherein the mold die set cleaner further comprises a second plurality of nozzles through which the parting compound is provided to coat the second surface of the mold die set.

12. The apparatus of claim 11, wherein the parting compound is provided by being sprayed from the second plurality of nozzles.

13. The apparatus of claim 8, wherein the parting compound is provided by being sprayed from the plurality of nozzles.

14. The apparatus of claim 8, wherein the mold die set cleaner further comprises a second vacuum hale that receives the separated residue from the second surfaces of the mold die set.

15. The apparatus of claim 1, wherein the plurality of nozzles and plurality of holes are coplanar.

* * * * *